United States Patent
Chang

(10) Patent No.: US 9,331,652 B2
(45) Date of Patent: May 3, 2016

(54) AUTO GAIN ADJUSTING DEVICE AND METHOD THEREOF

(71) Applicant: Realtek Semiconductor Corp., Hsinchu (TW)

(72) Inventor: Yuan-Shuo Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 72 days.

(21) Appl. No.: 14/247,669

(22) Filed: Apr. 8, 2014

(65) Prior Publication Data

US 2014/0300418 A1    Oct. 9, 2014

(30) Foreign Application Priority Data

Apr. 9, 2013  (TW) .............................. 102112445 A

(51) Int. Cl.
*H04B 1/04* (2006.01)
*H03G 3/00* (2006.01)
*H03G 3/30* (2006.01)

(52) U.S. Cl.
CPC .................................. *H03G 3/3042* (2013.01)

(58) Field of Classification Search
CPC ... H03F 1/0222; H03F 1/3211; H03F 1/3241; H03F 1/3247; H03F 3/24; H03F 2200/451; H03F 2201/3233; H04B 1/0425; H04B 1/0475; H04B 2001/0408; H04B 2001/0433; H04B 17/0085; H04B 17/10; H03G 3/3042
USPC ............ 455/63.1, 67.11, 67.13, 114.1, 114.2, 455/114.3, 115.1, 115.2, 115.3, 1, 26, 455/127.1, 127.2, 127.3, 67.14; 375/296, 375/297; 330/250, 252, 254, 260, 278, 282
See application file for complete search history.

(56) References Cited

U.S. PATENT DOCUMENTS

| 5,381,108 | A  | * | 1/1995 | Whitmarsh et al. | ........... 455/126 |
| 7,043,213 | B2 | * | 5/2006 | Robinson et al.  | .......... 455/127.2 |
| 7,113,036 | B2 | * | 9/2006 | Moffatt et al.   | ................ 330/149 |
| 7,539,466 | B2 | * | 5/2009 | Tan et al.       | ................... 455/127.1 |

\* cited by examiner

*Primary Examiner* — Quochien B Vuong
(74) *Attorney, Agent, or Firm* — Muncy, Geissler, Olds & Lowe, P.C.

(57) ABSTRACT

An auto gain adjusting device and method is disclosed. The auto gain adjusting device comprises a predistorter, a gain unit, a power amplifier, a receiving unit and a calculation unit. The predistorter generates a plurality of test signals in a calibration mode, wherein the powers between a current test signal and a previous test signal includes a first difference value. The gain unit provides a substantially constant gain value to the current test signal and the previous test signal to generate a current amplified test signal and a previous amplified test signal. The power amplifier amplifies the current amplified test signal and the previous amplified test signal to generate a first transmitting signal and a second transmitting signal. The receiving unit converts the first transmitting signal and the second transmitting signal into a first baseband signal and a second baseband signal respectively. The calculation unit calculates a second difference value between powers of the first baseband signal and the second baseband signal, and compares the second difference value with the first difference value to determine whether the substantially constant gain value causes the plurality of test signals to be operated in a linear region and a compression region of the power amplifier.

20 Claims, 15 Drawing Sheets

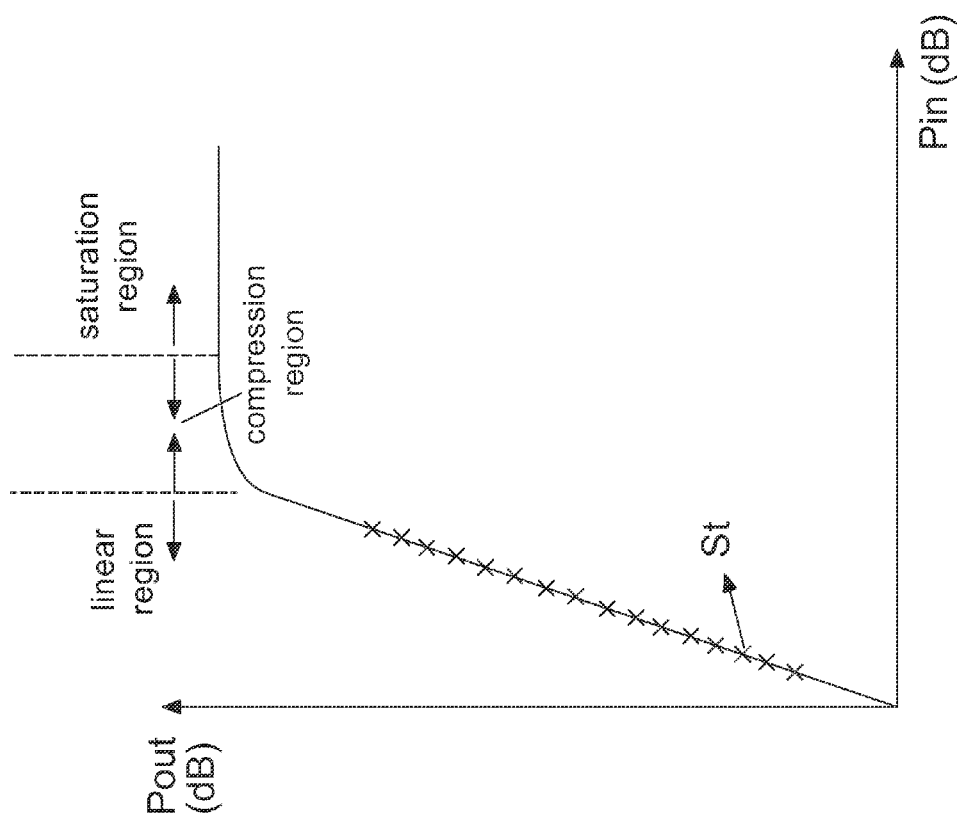

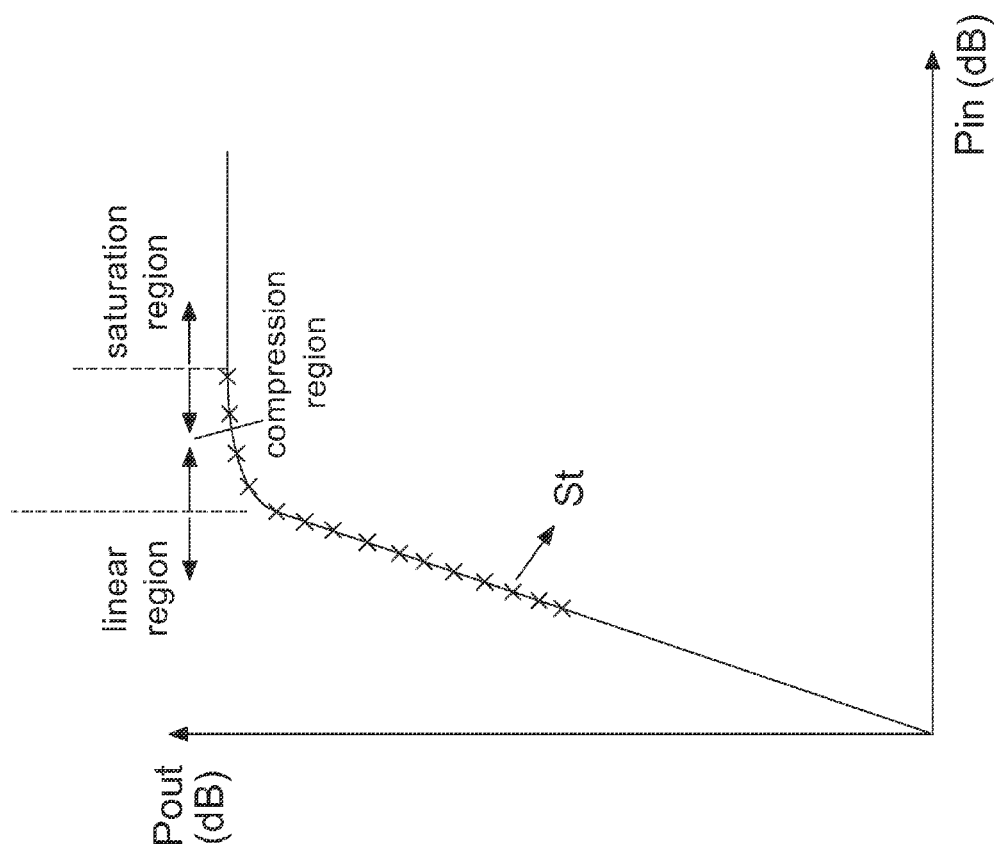

| register(3:0) | gain | register(3:0) | gain |
|---|---|---|---|
| 15(b'1111) | +6 dB | 7(b'0111) | -2 dB |
| 14(b'1110) | +5 dB | 6(b'0110) | -3 dB |
| 13(b'1101) | +4 dB | 5(b'0101) | -4 dB |
| 12(b'1100) | +3 dB | 4(b'0100) | -5 dB |
| 11(b'1011) | +2 dB | 3(b'0011) | -6 dB |
| 10(b'1010) | +1 dB | 2(b'0010) | -7 dB |
| 9 (b'1001) | +0 dB | 1(b'0001) | -8 dB |
| 8 (b'1000) | -1 dB | 0(b'0000) | -9 dB |

FIG. 4B

| m | E | F | $Gain_m$ | $Norm\_Gain_m$ | $L_m$ | $Gain\_idx$ |
|---|----|----|------|-----|-----|---|
| 1 | 86 | 33 | 8485 | 512 | 256 | |
| 2 | 80 | 32 | 7424 | 448 | 192 | |
| 3 | 80 | 31 | 7361 | 444 | 188 | |
| 4 | 81 | 31 | 7522 | 453 | 197 | |
| 5 | 85 | 29 | 8066 | 487 | 231 | |
| 6 | 83 | 25 | 7514 | 453 | 197 | |
| 7 | 77 | 22 | 6413 | 387 | 131 | |
| 8 | 72 | 19 | 5545 | 335 | 79 | |
| 9 | 66 | 16 | 4612 | 278 | 22 | 9 |
| 10 | 60 | 14 | 3796 | 229 | 27 | |
| 11 | 54 | 12 | 3060 | 185 | 71 | |
| 12 | 52 | 9 | 2785 | 168 | 88 | |
| 13 | 48 | 7 | 2353 | 142 | 114 | |
| 14 | 36 | 4 | 1312 | 79 | 177 | |
| 15 | 25 | 1 | 626 | 38 | 218 | |
| 16 | 15 | 1 | 226 | 14 | 242 | |

FIG. 5B

AUTO GAIN ADJUSTING DEVICE AND METHOD THEREOF

This application claims the benefit of the filing date of Taiwan Application Ser. No. 102112445, filed on Apr. 9, 2013, the content of which is incorporated herein by reference.

BACKGROUND OF THE INVENTION

1. Field of the Invention

The invention relates to a control device.

2. Description of the Related Art

In regard to signal processing techniques for a compression region of a power amplifier (hereinafter called PA) in a high-speed radio communications, a digital predistortion approach can compensate the state of PA linearity and reduce hardware cost, especially, in the applications of digital signal processors. The digital predistortion scheme is for compensating transmission signals in advance for the distortion caused by the power amplifier.

FIG. 1 is a diagram of a conventional predistorter 11 and a conventional power amplifier 12. A graph (A) in the bottom-left portion of FIG. 1 shows a transfer characteristic curve of input power versus output power of predistortion compensation; a graph (B) in the bottom-middle portion of FIG. 1 is a transfer characteristic curve of input power versus output power of a power amplifier; a graph (C) in the bottom-right portion of FIG. 1 shows a transfer characteristic curve of input power versus output power of the power amplifier with predistortion. The predistorter unit 11 supplies a predistortion signal P to the power amplifier 12 such that a linear amplification (as shown in graph (C)) of the input signal of the power amplifier is achieved by combining the two transfer characteristics (as shown in graphs (A) and (B)).

The power amplifier operates in a linear region, a compression region, or a saturation region according to the power magnitude of the input signal. In a situation, the power magnitude of the input signal is too large such that the power amplifier operates in the saturation region and the predistortion cannot compensate the signal distortion. Thus, it is very important to appropriately confine the power magnitude of the input signal to the compression region and the linear region of the power amplifier.

SUMMARY OF THE INVENTION

In view of the above-mentioned problems, an object of the invention is to provide a device and method of automatically adjusting a gain of a gain stage, to thereby confine input signals of a power amplifier to a linear region and a compression region.

Another object of the invention is to provide a device and method of automatically adjusting a gain of a gain stage, to help a predistorter with determining a gain of a gain stage when the predistorter is in calibration mode for calibration process.

An embodiment of the invention provides an auto gain adjusting device. The auto gain adjusting device includes a predistorter, a gain unit, a power amplifier, a receiving unit and a calculation unit. The predistorter generates a plurality of test signals in a calibration mode, wherein the powers between a current test signal and a previous test signal includes a first difference value. The gain unit provides a substantially constant gain value to the current test signal and the previous test signal to generate a current amplified test signal and a previous amplified test signal. The power amplifier amplifies the current amplified test signal and the previous amplified test signal to generate a first transmitting signal and a second transmitting signal. The receiving unit converts the first transmitting signal and the second transmitting signal into a first baseband signal and a second baseband signal respectively. The calculation unit calculates a second difference value between powers of the first baseband signal and the second baseband signal, and compares the second difference value with the first difference value to determine whether the substantially constant gain value causes the plurality of test signals to be operated in a linear region and a compression region of the power amplifier.

Another embodiment of the invention provides an auto gain adjusting method. The method includes steps of: supplying a plurality of test signals sequentially, wherein the powers between a current test signal and a previous test signal includes a first difference value; providing a substantially constant gain value to the current test signal and the previous test signal to generate an current amplified test signal and a previous amplified test signal; amplifying the current amplified test signal and the previous amplified test signal to generate a first transmitting signal and a second transmitting signal; converting the first transmitting signal and the second transmitting signal into a first baseband signal and a second baseband signal respectively; calculating a second difference value between powers of the first baseband signal and the second baseband signal and determining whether the second difference value is less than a threshold; and when the second difference value is less than the threshold, checking what number sequence does the current test signal rank in the plurality of test signals, calculating a register value according to the number sequence of the current test signal operated in the saturation region of a power amplifier, and setting a gain value corresponding to the register value as the substantially constant gain value.

Another embodiment of the invention provides an auto gain adjusting method. The method includes steps of: setting a register value of a gain stage to a maximum gain value of the gain stage; providing a predistorter for supplying a plurality of test signals to be transmitted through a power amplifier; providing a power gain scan unit for calculating a plurality of gain values of the plurality of test signals passing through the power amplifier; comparing the gain values causing the power amplifier to operate in a compression region and a linear region to obtain a compression state associated with the plurality of gain values; and determining a setting of the register value of the gain stage according to the compression state associated with the plurality of gain values; wherein the predistorter performs predistortion calibration according to the setting of the register value of the gain stage.

According to embodiments of the invention, an auto gain adjusting device and method can automatically detect the received powers or the gain values derived from the test signals and automatically adjust a register of a gain stage to a value so as to let the power amplifier either work about to enter the saturation region or to operate within the compression region. The invention effectively uses the test signals to track the characteristic of the power amplifier and automatically adjusts the gain of the gain unit to confine the input signals of the power amplifier to the linear region and the compression region, to effectively compensate for the system performance loss due to the distortion characteristic of the power amplifier.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3A shows a transfer characteristic curve of input power versus output power of a power amplifier that receives test signals according to an embodiment of the invention.

FIG. 3B shows a transfer characteristic curve of input power versus output power of a power amplifier that receives test signals according to another embodiment of the invention.

FIG. 4B is an exemplary table that the auto gain adjusting device sets a register of a gain stage according to an embodiment of the invention.

FIG. 5B is an exemplary operation table of the auto gain adjusting device in FIG. 5A according to an embodiment of the invention.

DETAILED DESCRIPTION OF THE INVENTION

Figure 1:
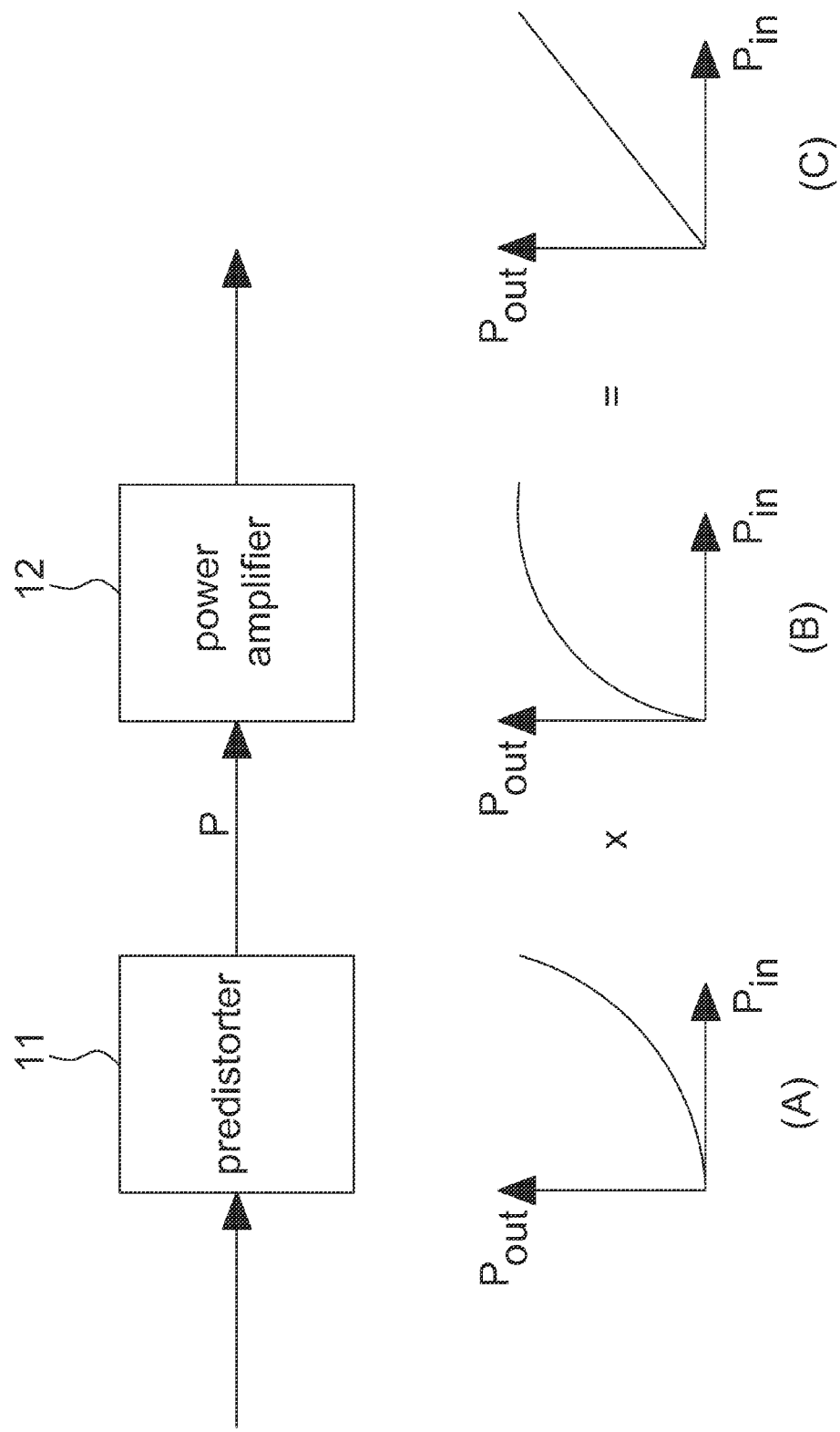
FIG. 1 is a diagram of a predistorter and a power amplifier according to prior arts.
Figure 2A:
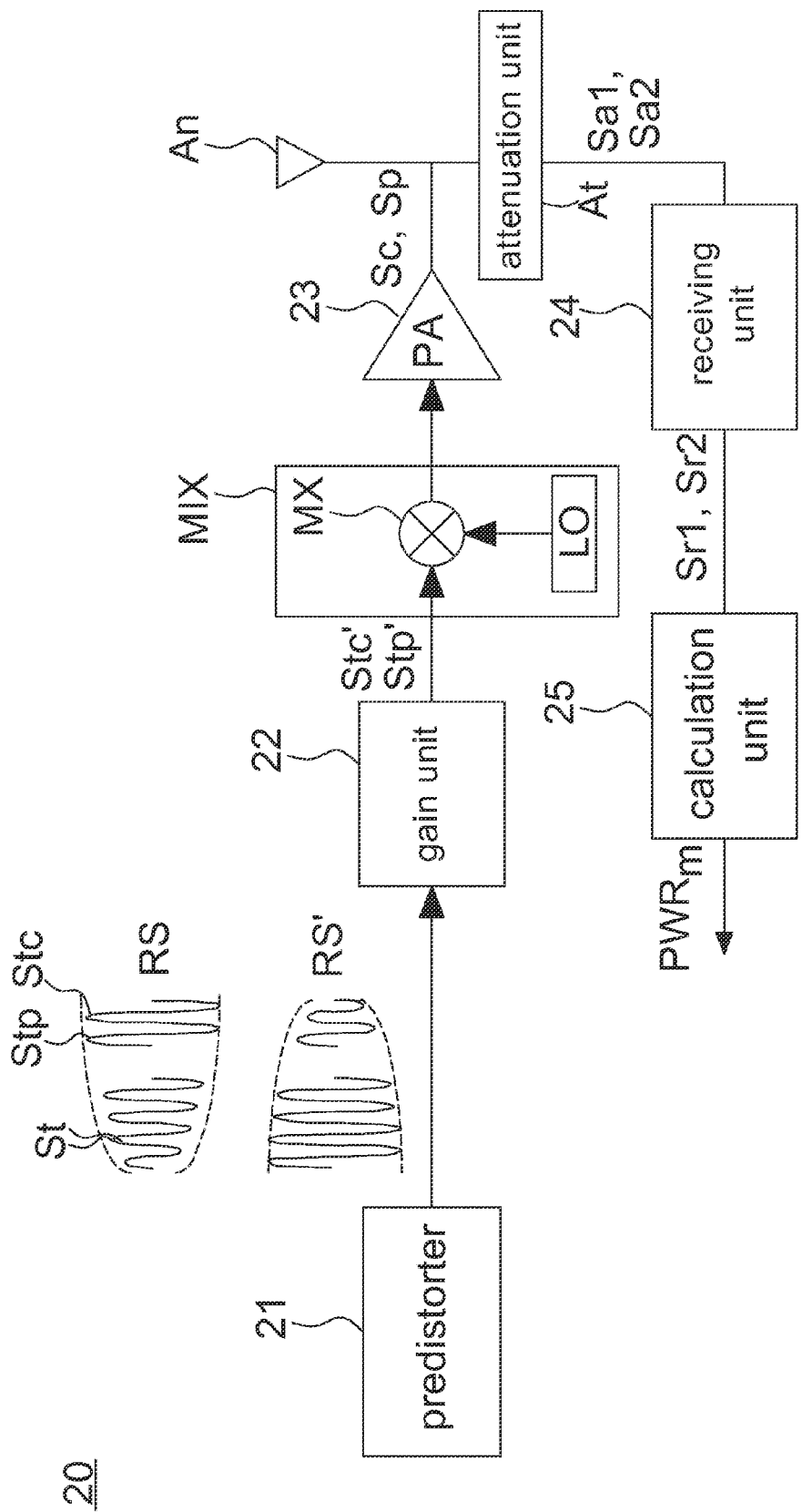
FIG. 2A is a schematic diagram of an auto gain adjusting device according to an embodiment of the invention.

FIG. 2A is a schematic diagram of an auto gain adjusting device according to an embodiment of the invention. Referring to FIG. 2A, an auto gain adjusting device 20 of the invention includes a predistorter 21, a gain unit 22, a mixing circuit MIX, a power amplifier 23, an antenna An, an attenuation unit At, a receiver 24 and a calculation unit 25. Here, the mixing circuit MIX includes a mixing unit MX and a local oscillation unit LO. In an embodiment, the auto gain adjusting device 20 is disposed in an analog front end circuit which sends signals in response to the control of a digital signal processor (not shown).

The predistorter 21 is coupled with the power amplifier 23. The predistorter 21 detects an error between the input signal and the output signal of the power amplifier 23 to compensate for the power amplifier distortion. In an embodiment, as shown in the upper portion of FIG. 2B, the predistorter 21 includes a calculation circuit 21a, a temperature sensor 21b and a memory unit 21c. Here, the temperature sensor 21b is optional depending on different needs. The calculation circuit 21a calculates the relation between the input and output signals of the power amplifier 23 to generate a predistortion value. The memory unit 21c generates a predistortion data table according to the predistortion value and a digital signal processor adjusts the input signal state of the power amplifier 23 according to the predistortion data table. When the temperature sensor 21b is included, the temperature sensor 21b senses the temperature changes to generate a sensing signal and provide a corresponding predistortion signal according to the value of the sensing signal. In this manner, the predistorter 21 can be aware of the error state between the input signal and the output signal of the power amplifier 23 in advance and then supply the error state to the digital signal processor, thereby achieving a linear amplification of the input signal of the power amplifier 23

Figure 2B:
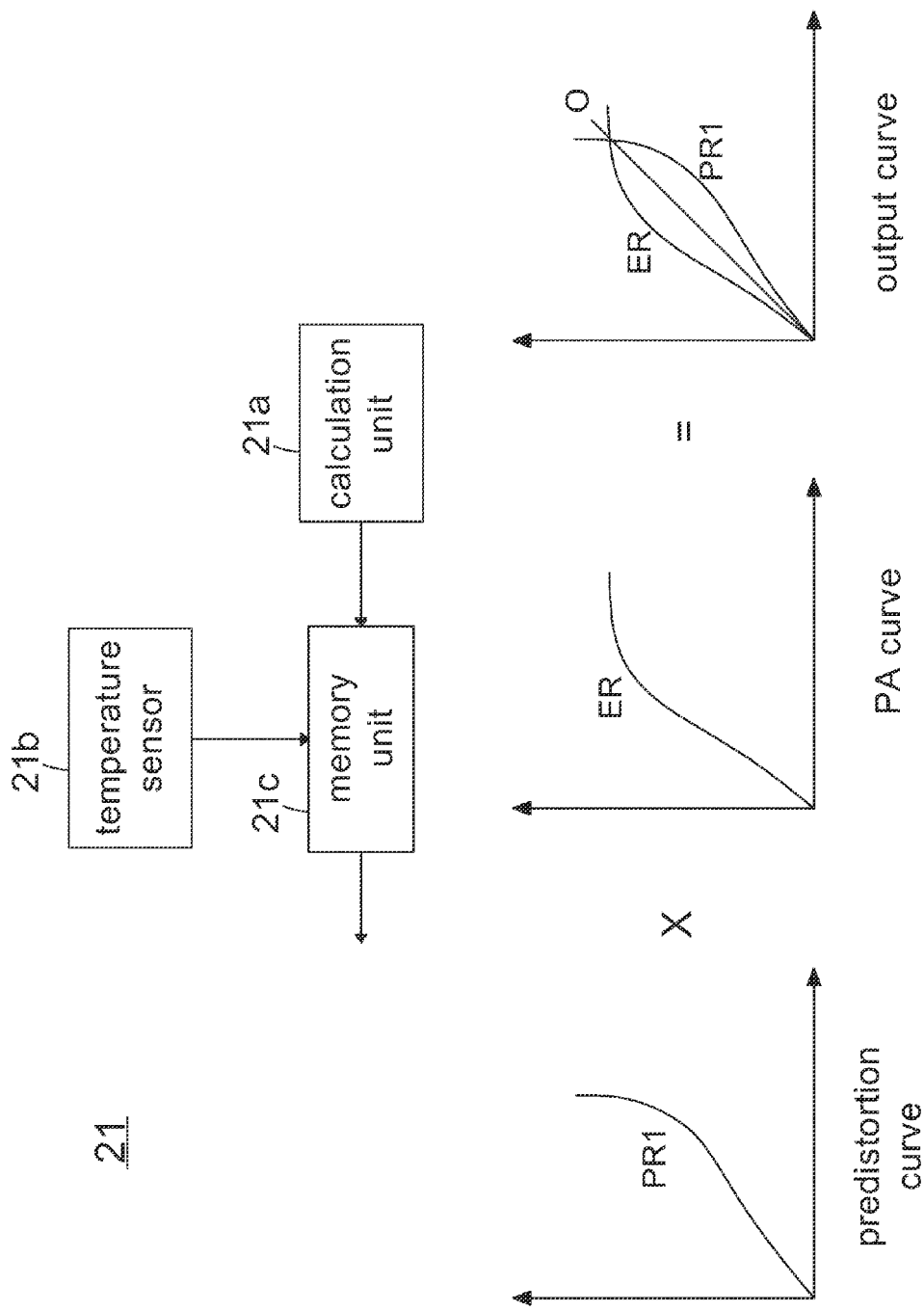
FIG. 2B is a schematic diagram of a predistorter according to an embodiment of the invention.

For example, the predistorter 21 detects the predistortion curve PR1 as shown in the bottom-left portion of FIG. 2B; the power amplifier 23 generates the distorted transmitting signal curve ER as shown in the bottom-middle portion of FIG. 2B. In an embodiment, according to the predistortion curve PR1, the digital signal processor compensates for the distorted transmitting signal curve ER of the power amplifier 23 to obtain an output signal curve O (=ER*PR1) with improved linearity, to thereby enhance the linearity of the power amplifier 23.

When the auto gain adjusting device 20 performs auto gain operations, the predistorter 21 supplies a plurality of test signals St to the gain unit 22. In an embodiment, the plurality of test signals St at least includes a current test signal Stc and a previous test signal Stp. Here, the powers of between the current test signal Stc and the previous test signal Stp includes a first difference value, wherein first difference value is equal to a first preset value. The plurality of test signals St form a compound test signal RS (or an inverse compound test signal RS'; the inverse compound test signal RS' is an inverse signal of the compound test signal RS).

In an embodiment, the compound test signal RS includes a plurality of test signals St (such as sine signals) and the amplitude of each sine signal is increased sequentially; the inverse compound test signal RS' includes a plurality of test signals St (such as sine signals) and the amplitude of each sine signal is decreased sequentially. Therefore, the difference between the powers of the current test signal Stc and the previous test signal Stp is equal to the first preset value.

The gain unit 22 receives the current test signal Stc and the previous test signal Stp, and then generates a substantially constant gain value to amplify the current test signal Stc and the previous test signal Stp to generate a current amplified test signal Stc' and a previous amplified test signal Stp'.

The mixing unit MX mixes the output signal of the local oscillation unit LO with both the current amplified test signal Stc' and a previous amplified test signal Stp' to convert the current amplified test signal Stc' and a previous amplified test signal Stp' from baseband signals to a first and a second radio frequency (RF) signals.

The power amplifier 23 receives and amplifies the first and the second RF signals to generate a first transmitting signal Sc and a second transmitting signal Sp to be transmitted via the antenna An.

The attenuation unit At, coupled between the output terminal of the power amplifier 23 and the receiving unit 24, receives the first transmitting signal Sc and the second transmitting signal Sp. The attenuation unit At performs power attenuation operations on the first transmitting signal Sc and the second transmitting signal Sp to obtain a first and a second attenuation signals Sa1, Sa2 in an ideal power range.

The receiving unit 24, coupled to the attenuation unit At, receives the first and the second attenuation signals Sa1, Sa2 to generate a first and a second receiving signals Sr1, Sr2.

The calculation unit 25, coupled to the receiving unit 24, receives the first and the second receiving signals Sr1, Sr2, and measures and calculates the powers of the first receiving signal Sr1 and the second receiving signal Sr2 respectively to obtain a first power $PWR_m$ and a second power $PWR_{m-1}$. In addition, the calculation unit 25 calculates the second difference value between first power $PWR_m$ and a second power $PWR_{m-1}$ to generate a second difference value, and compares the second difference value with the first difference value (first preset value) to determine whether the substantially constant gain value causes the plurality of test signals St to be operated in the compression region and the linear region of the power amplifier 23.

Please be noted that when the test signals pass through the gain unit 22 and the mixing unit MX, the input signal power (in units of decibels (dB)) at the input terminal of the power amplifier 23 is equal to the power of the test signal St plus the power of the substantially constant gain provided by the gain unit 22. Assuming that the mixing unit MX simply converts the amplified test signals into the RF signals without providing any power; thus, it is realized that the power of the test signal at the input terminal of the power amplifier 23 mainly depends on the gain provided by the gain unit 22.

Figure 3C:
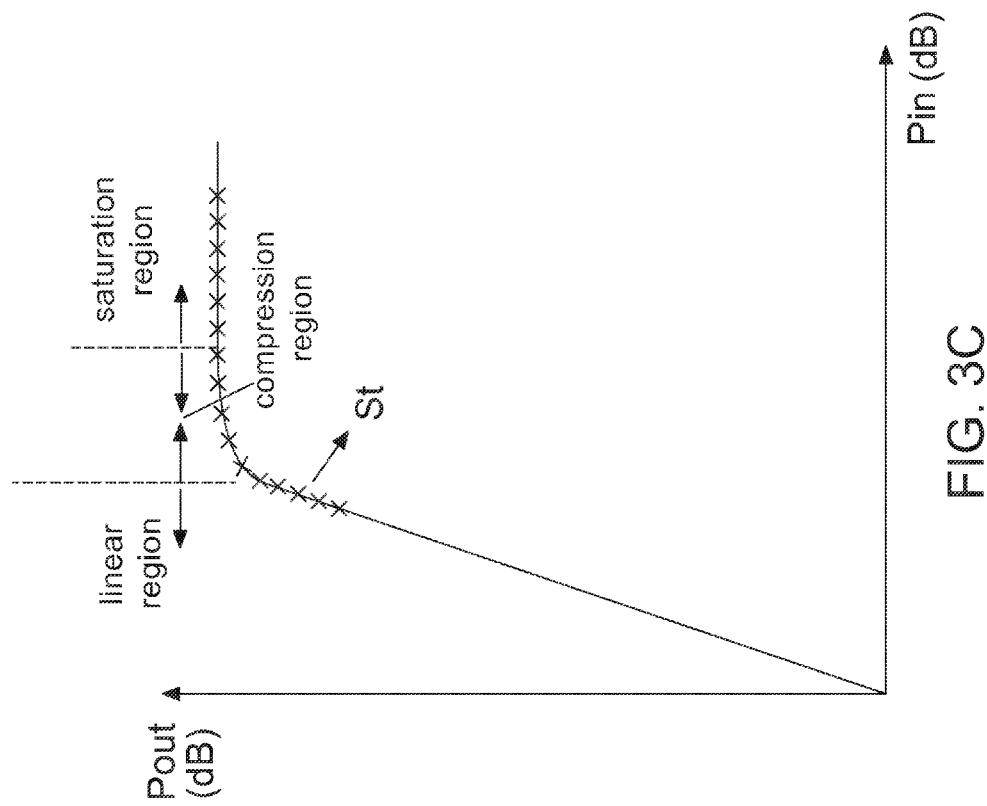
FIG. 3C shows a transfer characteristic curve of input power versus output power of a power amplifier that receives test signals according to another embodiment of the invention.

Please refer to FIGS. 3A, 3B and 3C. Since each test signal St after amplification is confined to the linear region of the power amplifier 23 in FIG. 3A, only the relations between input powers and output powers of the power amplifier 23 in the linear region can be observed, without knowing the relations between input powers and output powers of the power amplifier 23 in the compression region. When the input signals are confined in the linear region, the output signals are amplified without distortion, so it is not necessary to use the predistorter 21 to compensate for signal distortion. In FIG. 3C, each test signal St after amplification is confined to the saturation region of the power amplifier 23. The fact that the power amplifier 23 operates in the saturation region causes the predistorter 21 to be unable to perform compensation effectively. In FIG. 3B, since each test signal St after amplification is confined to the linear region and the compression region of the power amplifier 23, the circuit can use the predistorter 21 to compensate for signal distortion with a known characteristic of the compression region. Accordingly, an object of the auto gain adjusting device 20 of the invention is to use the test signals St to track the relations between the input powers and output powers in the linear region and the compression region of the power amplifier 23, to thereby make good use of the characteristic of the compression region.

In an embodiment, when the power amplifier 23 operates in the linear region, the calculation unit 25 calculates the second difference value between the first power $PWR_m$ and the second power $PWR_{m-1}$ to obtain the second difference value equal to one dB. When the power amplifier 23 operates in the compression region, the second difference value between the first power $PWR_m$ and the second power $PWR_{m-1}$ gets smaller. Finally, when the power amplifier 23 operates in the saturation region, the second difference value between the first power $PWR_m$ and the second power $PWR_{m-1}$ is equal to zero dB. Thus, based on the above embodiment, a preset value is set to be in the range of 0 dB to 1 dB (i.e., any operating point in the compression region). When $PWR_m - PWR_{m-1}$ is smaller than the preset value, it indicates that the number of $m_{th}$ test signal St is operated in the compression region of the power amplifier 23. Therefore, according the information of the number of $m_{th}$ test signal St, the gain value of the gain unit 22 can be set properly to control all of the test signal St into the linear region and the compression region so that the predistorter 21 can compensate for signal distortion and power loss in the compensation region. Thus, when the power amplifier 23 operating in the compression region can be used to amplify and transmit signals correctly, the overall operating range increases and the effect of reducing costs is achieved.

Please be noted that the above second difference value equal to one dB is provided by example and not the limitations of the invention. In an alternative embodiment, the above second difference value can be set to other values depending on different needs.

In an alternative embodiment, the preset value may be set to an operating point of the compression region that is closest to the saturation region of the transfer characteristic curve, to thus achieve the highest utilization rate of the compression region.

Figure 4A:
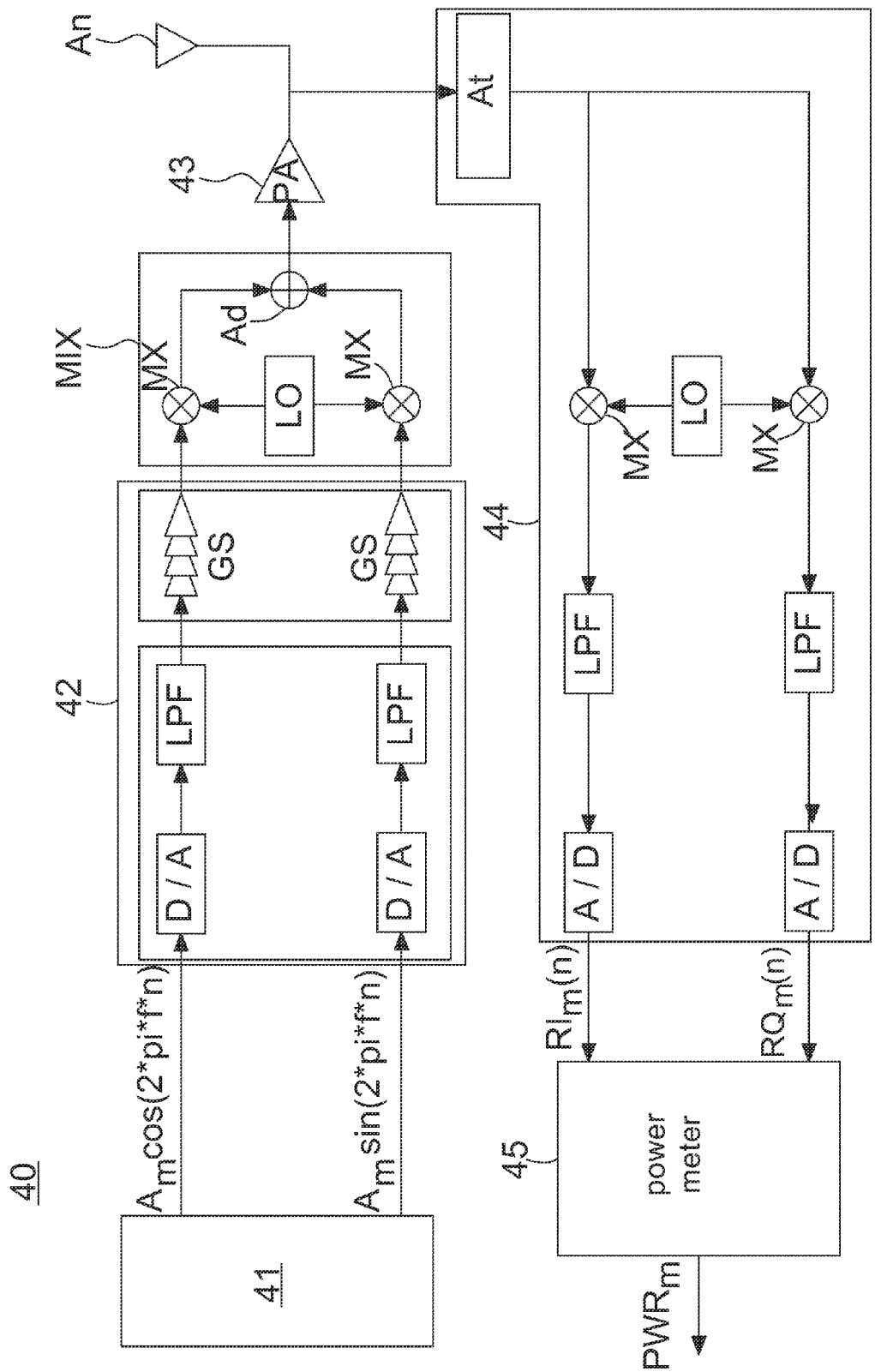
FIG. 4A is a schematic diagram of an auto gain adjusting device 40 according to another embodiment of the invention.

FIG. 4A is a schematic diagram of an auto gain adjusting device 40 according to another embodiment of the invention. The auto gain adjusting device 40 determines the gain value of a digital predistortion calibration.

Referring to FIG. 4A, the auto gain adjusting device 40 of the invention includes a predistorter 41, a gain unit 42, a mixing circuit MIX, a power amplifier 43, an antenna An, a receiving unit 44 and a power meter 45.

The gain unit 42 includes a pair of digital-to-analog converters D/A, a pair of low-pass filters LPF and a pair of gain stages GS. The mixing circuit MIX includes a pair of mixing units MX, a local oscillation unit LO and an adder Ad. The receiving unit 44 includes an attenuation unit At, a pair of mixing units MX, a local oscillation unit LO, a pair of low-pass filters LPF and a pair of analog-to-digital converters ND.

In an embodiment, the auto gain adjusting device 40 may set a register (not shown) of each gain stage GS to control the gain of the gain stages GS based on an example of FIG. 4B. Assuming that the gain stages GS operate in the ideal state and the maximum power of the amplified baseband signal is large enough to drive the power amplifier into the saturation region. In the embodiment of FIG. 4B, there are sixteen setting values, each corresponding to a gain value; in addition, any two adjacent gain values have a difference of 1 dB. Please be noted that the sixteen gain values are provided by example and not the limitations of the invention. In an alternative embodiment, any number of gain values can be used depending on different needs.

Figure 4C:
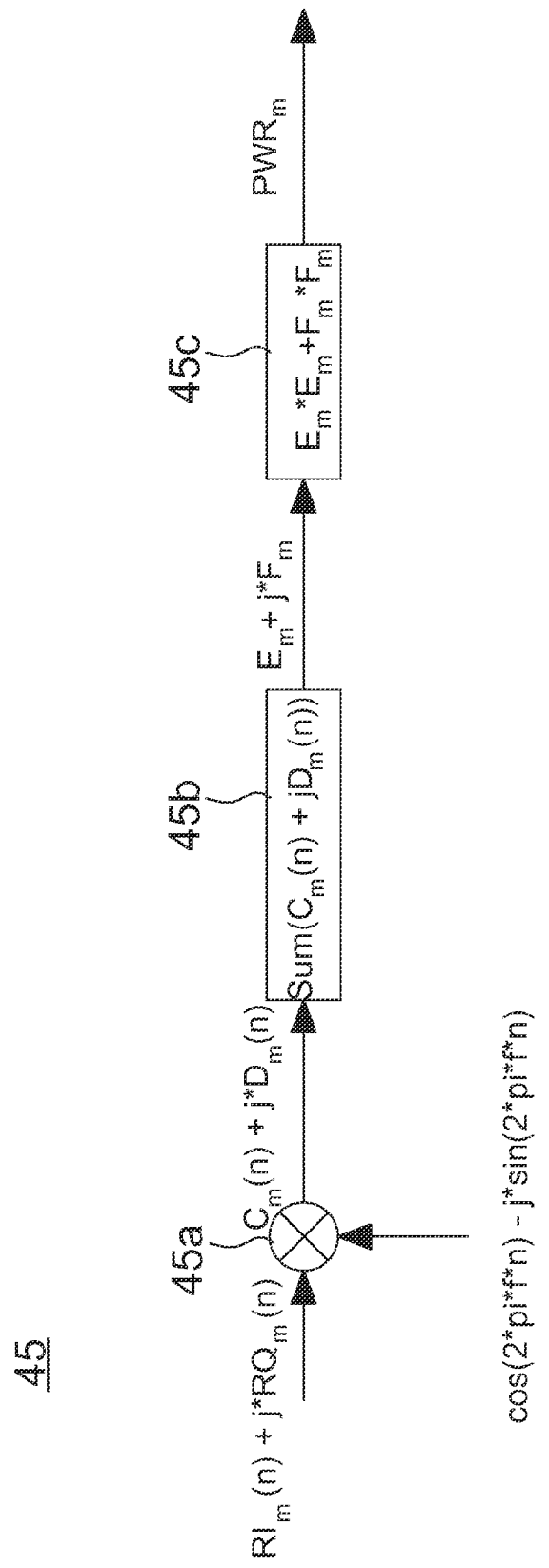
FIG. 4C is a schematic diagram of a power meter according to an embodiment of the invention.
Figure 4D:
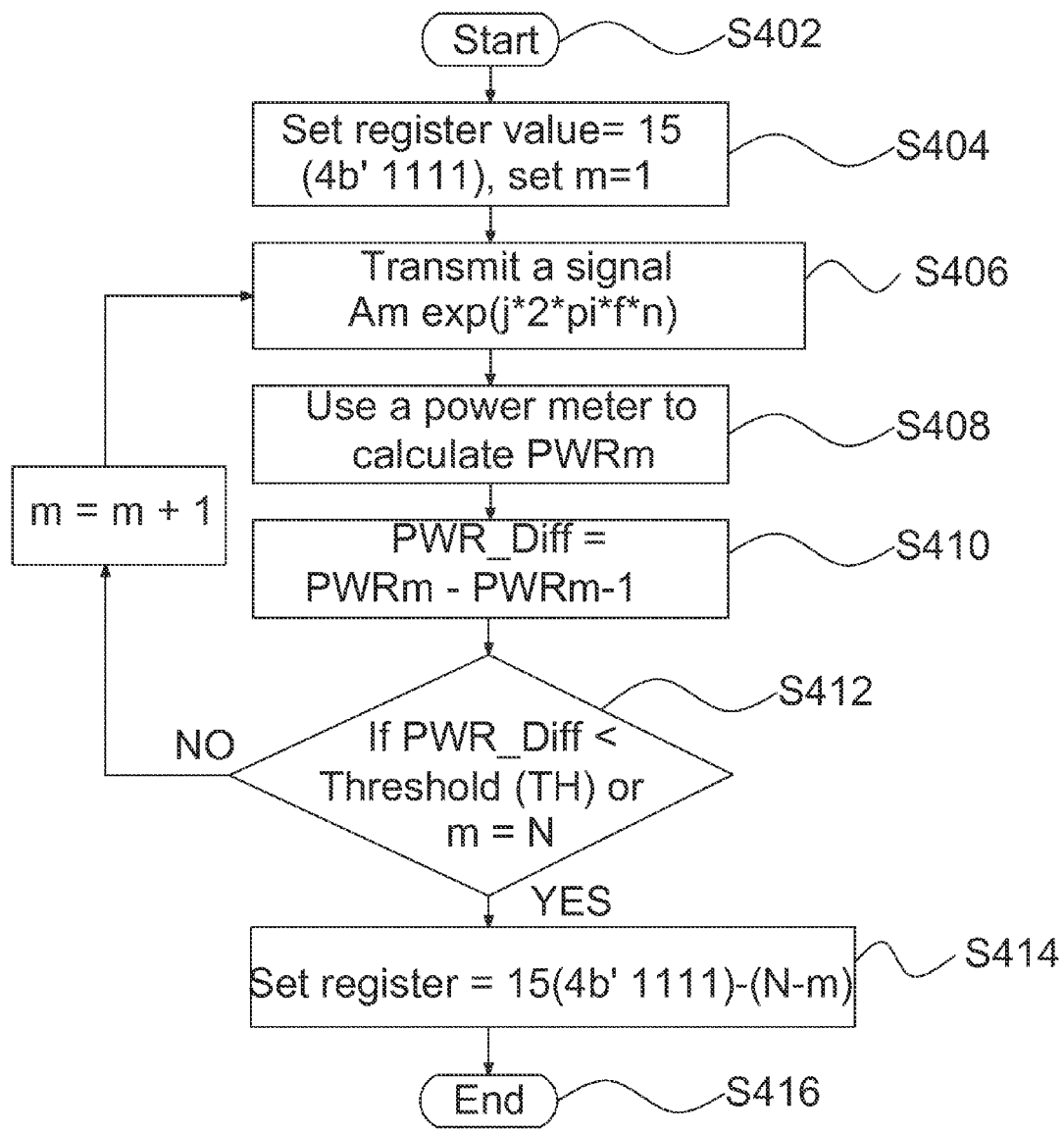
FIG. 4D is a flow chart of an auto gain adjusting method according to an embodiment of the invention.

FIG. 4D is a flow chart of an auto gain adjusting method according to another embodiment of the invention. Hereinafter, the auto gain adjusting method is described with reference to FIGS. 4A and 4D.

Step S402: Start.

Step S404: The auto gain adjusting device 40 can set the value of the register of each gain stage GS to 15 (4b'1111). In this embodiment, the value of the register of each gain stage GS can be set to the maximum (15 or 4b'1111), causing the output power of the power amplifier 43 to be closest to the saturated power. Then, set m=1, where m denotes the $m_{th}$ sine wave signal.

Step S406: When the auto gain adjusting device 40 operates, the predistorter 41 sends a compound test signal RS ($=A_m*\exp(j*2*pi*f*n)$) containing sixteen test signals St (sixteen complex sine wave signals in this embodiment) passing through the gain unit 42, the mixing circuit MIX, a power amplifier 43. Thus, there are sixteen sine wave signals having different powers passing through the power amplifier 43. Here, m=m+1 and m=1, 2, . . . , 16, due to the sixteen sine wave signals; exp( ) denotes an exponential function; exp(j*2*pi*f*n) denotes a sine wave signal including in-phase and quadrature components due to exp(j*2*pi*f*n)=cos(j*2*pi*f*n)+j*sin(j*2*pi*f*n). Here, the powers of the sixteen sine wave signals are increased by one dB step by step. Please be noted that the sixteen sine wave signals are provided by example and not the limitations of the invention. In an alternative embodiment, the test signals St can be waves of other types and the number of the test signals St can be adjusted depending on different needs.

The predistorter 41 sequentially sends the sixteen sine wave signals passing through the digital-to-analog converters D/A, the low-pass filters LPF and the gain stages GS of the gain unit 42. According to the substantially constant gain values contained in the register, such as 15(4b'1111), the gain stages amplify the sixteen sine wave signals. Then, after the mixing unit MX and the local oscillation unit LO of the mixing circuit MIX convert the sine wave baseband signals into radio frequency signals, the adder Ad performs addition operations and the power amplifier 43 performs amplification operations to generate a transmitting signal to be outputted via the antenna An.

Following that, a loopback path including the receiving unit 44 and the power meter 45 receives the transmitting signal containing the sixteen sine wave signals via the attenuation unit At. The transmitting signal containing the sixteen sine wave signals via the attenuation unit At is converted into a baseband signal via the attenuation unit At, the mixing unit MX and the local oscillation unit LO. Then, the baseband signal is converted into a digital signal including in-phase and quadrature components $RI_m(n)$ and $RQ_m(n)$ by the lowpass filter LPF and the analog-to-digital filter ND.

Step S408: The power meter 45 of the auto gain adjusting device 40 calculates the first power $PWR_m$ of the current sine wave signal and the second power $PWR_{m-1}$ of the previous sine wave signal, respectively.

Step S410: The power meter 45 of the auto gain adjusting device 40 calculates a second difference value between powers of the first power $PWR_m$ and the second power $PWR_{m-1}$. The power meter 45 calculates the sixteen powers $PWR_m$ derived from the sixteen sine wave signals $RI_m(n)$ and $RQ_m(n)$ to illustrate the power diagrams of FIGS. 3A-3C.

Take FIG. 3C for example. When the sine wave signals are operated within the linear region of the power amplifier 43, the received power $PWR_m$ derived from each sine wave is increased by 1 dB step by step; when the sine wave signals are operated within the compression region of the power amplifier 43, the second difference value between the received powers $PWR_m$ derived from any two adjacent sine waves is in the range of 1 dB to 0 db; when the sine wave signals are operated within the saturation region of the power amplifier 43, the received powers $PWR_m$ derived from two adjacent sine waves are equal, so their differences are 0 db. Further, the above second difference value of 1 dB is provided by example and not the limitations of the invention. In an alternative embodiment, the second difference value can be adjusted depending on different needs.

FIG. 4C is a schematic diagram of a power meter according to another embodiment of the invention. Referring to FIG. 4C, the power meter 45 includes a multiplier 45a, a first calculation unit 45b and a second calculation unit 45c. As shown in FIG. 4A, the power meter 45 receives the test signals RS, each of which is combination of a in-phase signal $RI_m(n)$ and an quadrature signal $RQ_m(n)$, i.e., $RI_m(n)+j*RQ_m(n)$.

Next, the multiplier 45a multiplies the signal $(RI_m(n)+j*RQ_m(n))$ by $(\cos(2*pi*f*n)-j*\sin(2*pi*f*n))$ to produce a signal $(C_m(n)+j*D_m(n))$. The signal $(RI_m(n)+j*RQ_m(n))$ can be converted into an exponential form as follows: $A_m B*\exp(j*(2*pi*f*n+Phi))$, where B and Phi respectively denote the gain and the phase difference associated with the sine wave signal $Am*\exp(j*(2*pi*f*n))$ which is supplied by the predistorter 41 and then processed by the gain unit 42, the mixing circuit MIX, the power amplifier and the receiving unit 44. The exponential form of $(\cos(2*pi*f*n)-j*\sin(2*pi*f*n))$ is $\exp(-j*2*pi*f*n)$. Thus, the product of $A_m B*\exp(j*(2*pi*f*n+Phi))$ and $\exp(-j"2*pi*f*n)$ is $A_m B*\exp(j*Phi)$ while the complex number form of $A_m B*\exp(j*P_h i)$ is $(c_m(n)+j*D_m(n))$. The first calculation unit 45b adds $(C_m(n)+j*D_m(n))$ to produce $(E_m+j*F_m)$. The second calculation unit 45c multiplies $(E_m+j*F_m)$ by $(E_m-j*F_m)$ to generate the power value $PWR_m = E_m*E_m + F_m*F_m$.

Step S412: Determine whether the second difference value between the first power $PWR_m$ of the current sine wave signal and the second power $PWR_{m-1}$ of the previous sine wave signal is less than a threshold TH, i.e., $(PWR_m - PWR_{m-1}) < TH$. Alternatively, determine whether m>N, where m denotes the $m_{th}$ sine wave signal and N denotes the number of all the sine wave signals. In this manner, it can determine whether the sine wave signal is operated (or is about to be operated) within the saturation region, or whether all the sine wave signals have been transmitted completely. If Yes, the flow goes to step S414; otherwise the flow goes to step S406 and continue transmitting the next $(m+1)_{th}$ sine wave signal. Please be noted that the threshold TH can be set to less than the preset value and greater than 0 dB. The preset value can be 1 dB as the above embodiment or other values. Besides, the closer the threshold TH to 0 dB, the more the usage of the compression region.

Step S414: Set the value of the register of each gain stage GS to $(15(4b'1111)-(N-m))$. When knowing the received power of the $m_{th}$ sine wave signal causes the power amplifier 43 to operate (or be about to operate) within the saturation region, the auto gain adjusting device 40 sets the value of the register to $(15-(N-m))$. For example, when the output power of the fifteenth sine wave signal causes the power amplifier 43 to operate (or be about to operate) within the saturation region, then m=15. It is because the fifteenth sine wave signal is amplified through the gain stage GS (b'1111) and then operated (or is about to be operated) within the saturation region of the power amplifier 43. Accordingly, when the number of all the sine wave signals is sixteenth (N=16), the fifteenth and the sixteen sine wave signals are operated within the saturation region of the power amplifier 43 after being amplified by the gain stage GS (b'1111). Therefore, the value of the register of the gain stage GS can be adjusted to be 14(b'1110), i.e., b'1111-(N-m)=15-(16-15)=14=b'1110. In this example, 14 is the most appropriate value; thus, the register of the gain stage GS is set to 14(b'1110) at last.

Step S416: End.

It is noted that if no appropriate m value is found on condition that the register of the gain stage GS is set to 15(b'1111), set the value of the register of the gain stage GS to 14(b'1110) and then repeat the steps of S402-S416 to search for the most appropriate value that meets the requirement of the power amplifier 43.

In this manner, the auto gain adjusting device 40 can automatically detect the powers PWR derived from the test signals St and automatically set the register of the gain stage GS to a value that drives the power amplifier 43 either about to enter the saturation region or to operate within the compression region of the power amplifier 43, thus adjusting the gain automatically. The power of the amplified signal can be confined to the linear region and the compression region, to effectively make good use of the characteristic of the compression region of the power amplifier 43.

Figure 5A:
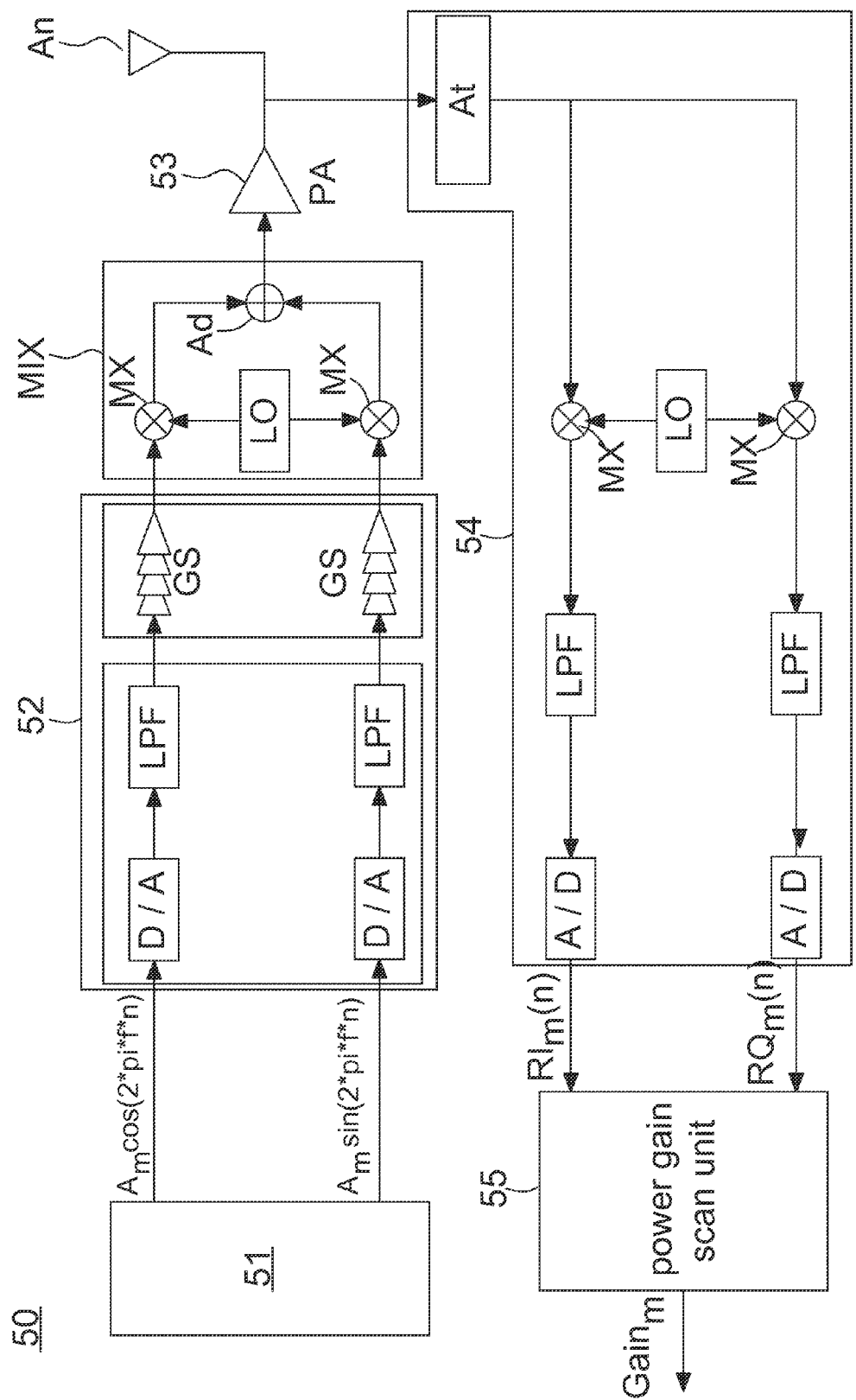
FIG. 5A is a schematic diagram of an auto gain adjusting device 50 according to another embodiment of the invention.

FIG. 5A is a schematic diagram of an auto gain adjusting device 50 according to another embodiment of the invention. The auto gain adjusting device 50 determines the gain value of a digital predistortion calibration.

Referring to FIG. 5A, the auto gain adjusting device 50 of the invention includes a predistorter 51, a gain unit 52, a mixing circuit MIX, a power amplifier 53, an antenna An, a receiving unit 54 and a power gain scan unit 55. The gain unit 52 includes a pair of digital-to-analog converters D/A, a pair of low-pass filters LPF and a pair of gain stages GS. The mixing circuit MIX includes a pair of mixing units MX, a local oscillation unit LO and an adder Ad. The receiving unit 54 includes an attenuation unit At, a pair of mixing units MX, a local oscillation unit LO, a pair of low-pass filters LPF and a pair of analog-to-digital converters ND. Here, the operations and the structure of the predistorter 51, the gain unit 52, the mixing circuit MIX, the power amplifier 53, the antenna An and the receiving unit 54 are approximately the same as those of the predistorter 41, the gain unit 42, the mixing circuit MIX, the power amplifier 43, the antenna An and the receiving unit 44 in FIG. 4A.

In an embodiment, the auto gain adjusting device 50 may set the register (not shown) of each gain stage GS to control the gain of the gain stages GS based on the example of FIG. 4B. Assuming that the gain stages GS operate in the ideal state and the maximum power of the amplified baseband signal is large enough to drive the power amplifier into the saturation region.

Figure 5C:
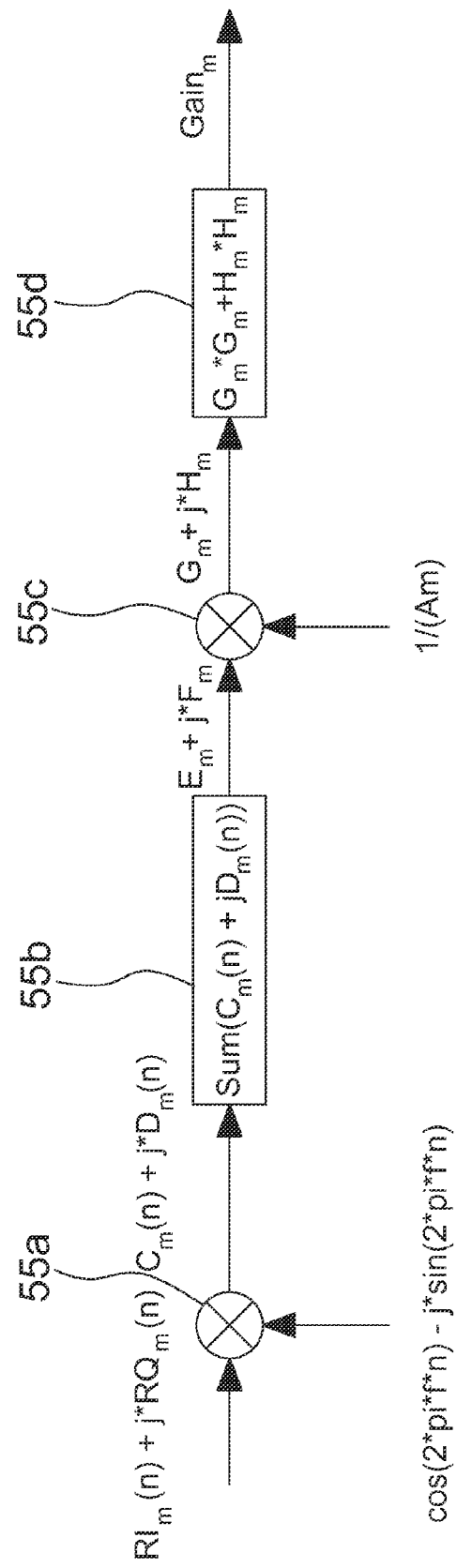
FIG. 5C is a schematic diagram of a power gain scan unit according to an embodiment of the invention.
Figure 5D:
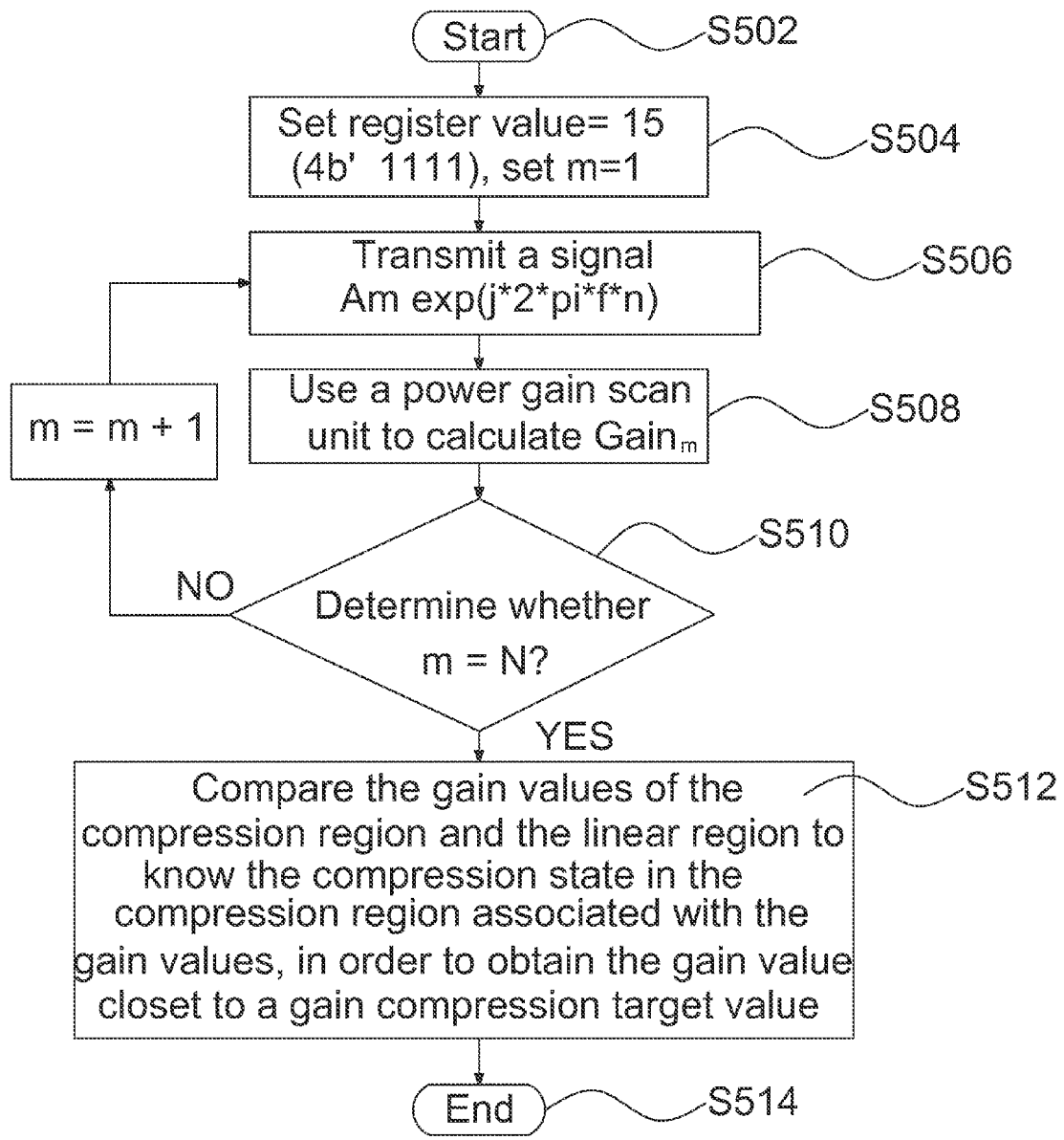
FIG. 5D is a flow chart of an auto gain adjusting method according to another embodiment of the invention.

FIG. 5D is a flow chart of an auto gain adjusting method according to another embodiment of the invention. Hereinafter, the auto gain adjusting method will be described with reference to FIGS. 5A and 5D.

Step S502: Start.

Step S504: The auto gain adjusting device 50 sets the value of the register of each gain stage GS to 15 (4b'1111). In this embodiment, the register of each gain stage GS can be set to the maximum (15 or 4b'1111), causing the output power of the power amplifier 53 to be closest to the saturated power. Then, set m=1, where m denotes the $m_{th}$ sine wave signal.

Step S506: When the auto gain adjusting device 50 operates, the predistorter 51 sends a compound test signal RS (=$A_m$*exp(j*2*pi*f*n)) containing sixteen test signals St (sixteen complex sine wave signals in this embodiment) passing through the gain unit 52, the mixing circuit MIX, a power amplifier 53. Thus, there are sixteen sine wave signals having different powers passing through the power amplifier 53. Here, m=m+1 and m=1, 2, . . . , 16, due to the sixteen sine wave signals; exp( ) denotes an exponential function; exp(j*2*pi*f*n) denotes a sine wave signal including in-phase and quadrature components due to exp(j*2*pi*f*n)=cos(j*2*pi*f*n)+j*sin(j*2*pi*f*n). Here, the powers of the sixteen sine wave signals are increased by one dB step by step. Please be noted that the sixteen sine wave signals are provided by example and not the limitations of the invention. In an alternative embodiment, the test signals St can be waves of other types and the number of the test signals St can be set to other numbers depending on different needs. Besides, the above value of one dB is provided by example and not the limitations of the invention. In an alternative embodiment, other value can be selected depending on different needs.

The predistorter 51 sequentially sends the sixteen sine wave signals passing through the digital-to-analog converters D/A, the low-pass filters LPF and the gain stages GS of the gain unit 52. According to the substantially constant gain value contained in the register, such as 15 (4b'1111), the gain stages GS amplifies the sixteen sine wave signals. Then, after the mixing unit MX and the local oscillation unit LO of the mixing circuit MIX convert the sine wave signals into radio frequency signals, the adder Ad performs addition operations and the power amplifier 53 performs amplification operations to generate a transmitting signal to be outputted via the antenna An.

Following that, a loopback path including the receiving unit 54 and the power gain scan unit 55 receives the transmitting signal containing the sixteen sine wave signals via the attenuation unit At. The transmitting signal containing the sixteen sine wave signals is converted into a baseband signal via the attenuation unit At, the mixing unit MX and the local oscillation unit LO. Then, the baseband signal is converted into a digital signal including in-phase and quadrature components $RI_m(n)$ and $RQ_m(n)$ by the lowpass filter LPF and the analog-to-digital converter A/D.

Step S508: The power gain scan unit 55 calculates the gain values $GAIN_m$ of the sixteen sine wave signals passing through the loopback path. Here, when the sixteen sine wave signals are operated in the linear region of the power amplifier 53, their gain values $GAIN_m$ are a substantial fixed value; when the sixteen sine wave signals are operated in the compression region of the power amplifier 53, their gain values $GAIN_m$ are less than the gain values associated with the signals operated in the linear region.

FIG. 5C is a schematic diagram of a power gain scan unit according to another embodiment of the invention. Referring to FIG. 5C, the power gain scan unit 55 includes a first multiplier 55a, a first calculation unit 55b, a second multiplier 55c and a second calculation unit 55d.

As shown in FIG. 5A, the power gain scan unit 55 receives the test signals RS, each of which is combination of a in-phase signal $RI_m(n)$ and an quadrature signal $RQ_m(n)$, i.e., $RI_m(n)$+$j*RQ_m(n)$.

Next, the first multiplier 55a multiplies the signal ($RI_m(n)$+$j*RQ_m(n)$) by (cos(2*pi*f*n)−j*sin(2*pi*f*n)) to produce a signal ($C_m(n)$+$j*D_m(n)$). The signal ($R_{Im}(n)$+$j*RQ_m(n)$) can be converted into an exponential form as follows: $A_m$B*exp(j*(2*pi*f*n+Phi)), where B and Phi respectively denote the gain and the phase difference associated with the sine wave signal Am*exp(j*(2*pi*f*n)) which is supplied by the predistorter 51 and then processed by the gain unit 52, the mixing circuit MIX, the power amplifier and the receiving unit 54. The exponential form of (cos(2*pi*f*n)−j*sin(2*pi*f*n)) is exp(−j*$_2$*pi*f*n). Thus, the product of $A_m$B*exp(j*(2*pi*f*n+Phi)) and exp(j*2*pi*f*n) is $A_m$B*exp(j*Phi) while the complex number form of $A_m$B*exp(j*Phi) is ($C_m(n)$+$j*D_m(n)$). The first calculation unit 45b adds ($C_m(n)$+$j*D_m(n)$) to produce ($E_m$+$j*F_m$). Thus, the signal ($E_m$+$j*F_m$) can be expressed as follows: ($E_m$+$j*F_m$)=B*$A_m$*exp(j*(2*pi*f*n+phi))*exp(−j*2*pi*f*n)=B*$A_m$*exp(j*phi). The second multiplier 55c multiplies (B*$A_m$*exp(j*phi)) by ($_1$/$A_m$), i.e., B*$A_m$*exp(j*Phi)/$A_m$=B*exp(j*Phi)=$G_m$+$j*H_m$. The second calculation unit 55d multiplies ($G_m$+$j*H_m$) by ($G_m$−$j*H_m$) to generate the following power gain value of the power amplifier 53: $Gain_m$=$G_m$*$G_m$+$H_m$*$H_m$.

Step S510: Determine whether the currently transmitting sine wave signals have been transmitted completely. If m=N, the flow goes to step S512; otherwise, the flow goes to step S506 and continue transmitting the next $(m+1)_{th}$ sine wave signal.

Figure 5E:
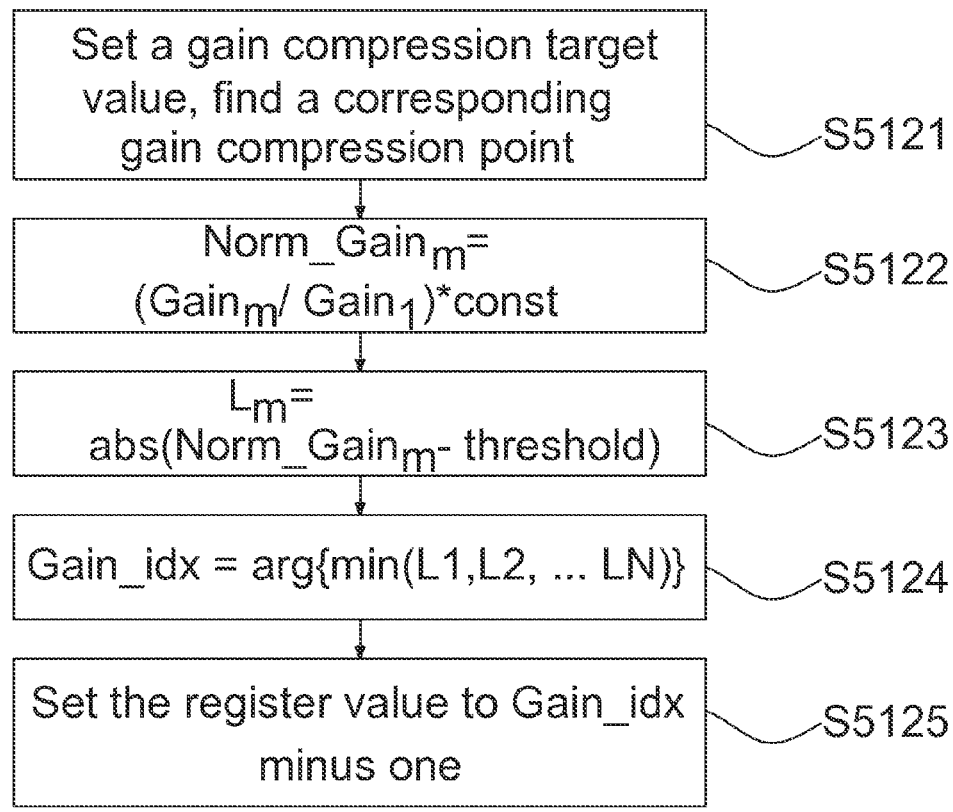
FIG. 5E is a flow chart of sub-steps of FIG. 5D.

Step S512: Compare the gain values of the compression region and the linear region to know the compressed states (degrees) in the compression region associated with the gain values, in order to obtain the gain value closet to a gain compression target value. As shown in FIG. 5E, the step S512 includes the following five sub-steps S5121, S5122, S5123, S5124 and S5125.

Sub-step S5121: Set a gain compression target value, such as 3 dB, and find a gain compression point of the power amplifier 53 corresponding to 3 dB. Please be noted that the 3 dB is provided by example and not the limitations of the invention. In an alternative embodiment, other value can be selected depending on different needs.

Sub-step S5122: Convert each power gain value $Gain_m$ into a normalized gain value $Norm\_Gain_m = ((Gain_m/Gain_1)*const$. Take the table of FIG. 5B for example. In a case that the sine wave signal $A_m*exp(j*2*pi*f*n)$ is operated in the linear region of the power amplifier 53 and its gain value const is set to 512, find the normalized gain value $Norm\_Gain_m$. If m=1 and its signals $G_1$=86 and $H_1$=23, $G_1$ and $H_1$ are respectively squared and then added together to obtain the power gain value $Gain_1$=8485. The power gain value 8485 can be normalized as follows: $(Gain_1=8485/Gain_1=8485)*(const=512)=512$. Likewise, if m=2 and its signals $G_2$=80 and $H_2$=22, $G_2$ and $H_2$ are respectively squared and then added together to obtain the power gain value $Gain_2$=7424. The power gain value 7424 can be normalized as follows: $(Gain_2=7424/Gain_1=8485)*(const=512)=448$. The rest may be deduced in the similar manner.

Sub-step S5123: Calculate the difference $L_m$ between each normalized gain value and the gain compression point, where $L_m = abs(Norm\_Gain_m - threshold)$. Since const is set to 512 and $10*\log_{10}(256/512) = -3$ dB, the gain compression point of 3 dB (i.e., the gain threshold value) is equal to 256. For example, the absolute value of a difference between $Norm\_Gain_m(=453)$ and 256 is 197. In this manner, the other differences Lm of FIG. 5B can be obtained.

Sub-step S5124: Compare all the normalized gain values $Norm\_Gain_m$ with the gain compression point 256 to find a gain index $Gain\_idx = arg\{min(L1, L2, \ldots LN)\}$. In other words, determine a minimum among all the differences L1~LN, i.e., determining $Norm\_Gain_m$ closest to the gain compression point 256. In FIG. 5B, the difference between $Norm\_Gain_m$ (=278) and 256 is 22, so L9(=22) is closest to the compression point 256. Therefore, the gain index Gain_idx is equal to 8 in this example.

Sub-step S5125: Set the value of the register according to the gain index as the gain value of the digital predistortion calibration. In this example, the value (=8 or b'1000) contained in the register is set by taking the gain index Gain_idx (=9) minus one.

Step S514: End.

Please be noted that the gain compression target value, the gain compression point and the gain value in the linear region of the power amplifier are provided by example and not the limitations of the invention. In an alternative embodiment, the values and the point can be adjusted depending on different needs.

In this manner, the auto gain adjusting device 50 sets a gain compression point based on the gain value of the linear region and a desired compression degree. Besides, the auto gain adjusting device 50 determines a gain value $Gain_m$ closest to the gain compression point among the gain values $Gain_m$ derived from the sixteen sine wave signals and sets the value of the register to m minus one (the $m_{th}$ sine wave signal) corresponding to the gain value $Gain_m$. In this manner, the power of the amplified signal is confined to the linear region and the compression region, to achieve the effect of adjusting the gain value automatically.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An automatic gain adjusting device, comprising:
a predistorter for generating a plurality of test signals in a calibration mode, wherein the powers between a current test signal and a previous test signal includes a first difference value;
a gain unit for providing a substantially constant gain value to the current test signal and the previous test signal to generate a current amplified test signal and a previous amplified test signal;
a power amplifier for amplifying the current amplified test signal and the previous amplified test signal to generate a first transmitting signal and a second transmitting signal;
a receiving unit for converting the first transmitting signal and the second transmitting signal into a first baseband signal and a second baseband signal respectively; and
a calculation unit for calculating a second difference value between powers of the first baseband signal and the second baseband signal and comparing the second difference value with the first difference value to determine whether the substantially constant gain value causes the plurality of test signals to be operated in a linear region and a compression region of the power amplifier.

2. The device according to claim 1, wherein the first difference value is equal to a preset value and the calculation unit is a power meter; and the power meter determines whether the second difference value is less than the preset value, wherein when the second difference is less than the preset value, it indicates the current test signal is operated in the compression region or the saturation region of the power amplifier so as to check what number sequence does the current test signal rank in the plurality of test signals.

3. The device according to claim 2, wherein the power meter calculates a register value according to the number sequence of the current test signal which is operated in the saturation region of the power amplifier, and sets a gain value corresponding to the register value as the substantially constant gain value.

4. The device according to claim 2, wherein when the second difference is less than a threshold, it indicates the number sequence of the current test signal having an input power drives the power amplifier into an entry of the saturation region, and wherein the threshold is less than the preset value and greater than 0 dB.

5. The device according to claim 1, wherein the substantially constant gain value is large enough to drive the power amplifier into a saturation region.

6. The device according to claim 1, wherein the power amplifier receives the plurality of test signals and generates the plurality of transmitting signals.

7. The device according to claim 6, wherein the calculation unit is a power gain scan unit, wherein the power gain scan unit calculates a plurality of power gain values of the plurality of transmitting signals, selects one power gain value closest to a gain threshold of a preset gain compression point according to the absolute values of differences between the power gain values and the gain threshold.

8. The device according to claim 7, wherein the power gain scan unit sets a register of a gain stage of the gain unit to an index corresponding to the one power gain value closest to the gain threshold to treat the gain value generated by the gain unit as the substantially constant gain value that the predistorter uses to perform predistortion calibration.

9. The device according to claim 7, wherein the preset gain compression point lies at a preset position in the compression region of the power amplifier.

10. The device according to claim 1, wherein the amplitudes of the plurality of the test signals are increased in sequence or decreased in sequence.

11. The device according to claim 1, wherein the power amplifier transmits the first transmitting signal and the second transmitting signal by an antenna.

12. An auto gain adjusting method, comprising:
supplying a plurality of test signals sequentially, wherein the powers between a current test signal and a previous test signal includes a first difference value;
providing a substantially constant gain value to the current test signal and the previous test signal to generate an current amplified test signal and a previous amplified test signal;
amplifying the current amplified test signal and the previous amplified test signal to generate a first transmitting signal and a second transmitting signal;
converting the first transmitting signal and the second transmitting signal into a first baseband signal and a second baseband signal respectively;
calculating a second difference value between powers of the first baseband signal and the second baseband signal and determining whether the second difference value is less than a threshold; and
when the second difference value is less than the threshold, checking what number sequence does the current test signal rank in the plurality of test signals, calculating a register value according to the number sequence of the current test signal operated in the saturation region of a power amplifier, and setting a gain value corresponding to the register value as the substantially constant gain value.

13. The method according to claim 12, wherein the first difference value is equal to a preset value and the threshold is less than the preset value and greater than 0 dB.

14. The method according to claim 12, wherein when the second difference is less than the threshold, the number sequence of the current test signal having an input power drives the power amplifier into or about to enter the saturation region.

15. An auto gain adjusting method, comprising:
setting a register value of a gain stage to a maximum gain value of the gain stage;
providing a predistorter for supplying a plurality of test signals to be transmitted through a power amplifier;
providing a power gain scan unit for calculating a plurality of gain values of the plurality of test signals passing through the power amplifier; and
comparing the plurality of gain values of the compression region and the linear region to determine the compressed states in the compression region associated with the plurality of gain values, in order to obtain the gain value closet to a gain compression target value, determining a setting of the register value of the gain stage according to the compression state associated with the plurality of gain values; wherein the predistorter performs predistortion calibration according to the setting of the register value of the gain stage.

16. The method according to claim 15, wherein the step of comparing the gain values further comprises:
setting a gain compression target value to find a gain compression point of the power amplifier corresponding to the gain compression target value.

17. The method according to claim 16, wherein the step of comparing the gain values further comprises:
converting the plurality of gain values into the plurality of normalized gain values.

18. The method according to claim 17, wherein the step of comparing the gain values further comprises:
calculating differences between the normalized gain values and the gain compression point to generate a plurality of absolute values of the differences.

19. The method according to claim 18, wherein the step of comparing the gain values further comprises:
searching the plurality of absolute values of the differences for a minimum to treat an index corresponding to the minimum as a gain index.

20. The method according to claim 19, wherein the step of comparing the gain values further comprises:
setting the register of a gain stage to the gain index corresponding to the one power gain value closest to a gain threshold;
so that the predistorter can perform predistortion calibration by using the gain value of the gain stage.

* * * * *